United States Patent
Muskovac

[15] 3,660,686

[45] May 2, 1972

[54] RAMP GENERATOR AND VARIABLE DUTY-CYCLE SWITCHING CIRCUIT

[72] Inventor: Nicholas G. Muskovac, Rockville, Md.

[73] Assignee: Vectrol, Inc., Rockville, Md.

[22] Filed: Apr. 29, 1970

[21] Appl. No.: 32,806

[52] U.S. Cl. ....................307/252 N, 307/228, 307/252 F, 307/252 T, 328/185, 331/111

[51] Int. Cl. ....................H03k 17/00

[58] Field of Search....................307/228, 252 J, 252 T, 262, 307/252 N; 331/111; 328/181, 185; 323/22

[56] References Cited

UNITED STATES PATENTS

| | | | |
|---|---|---|---|
| 3,254,313 | 5/1966 | Atkins et al. | 331/111 |
| 3,321,674 | 5/1967 | Felcheck et al. | 307/228 X |
| 3,146,392 | 8/1964 | Sylvan | 307/252 T |
| 3,221,183 | 11/1965 | White | 307/252 T |
| 3,395,334 | 7/1968 | Stein | 331/111 X |

*Primary Examiner*—John Zazworsky
*Attorney*—Fleit, Gipple & Jacobson

[57] ABSTRACT

A low noise level adjustable solid state circuit for controlling the power reaching a load. A sawtooth ramp generator is powered by a DC analog control voltage and delivers a signal to the primary control winding of a square loop core transformer, the secondary winding of which controls the operation of a pair of solid state thyristor switches. The ramp generator, in one embodiment produces a sawtooth signal which is variable in amplitude and which rides on top of a variable DC voltage level and, in another embodiment, produces a sawtooth signal of constant amplitude and which rides on top of a variable DC voltage level. The secondary winding of the transformer provides gating signals to the thyristor switches only when the trailing edges of the gate pulses occur within the half-cycle of positive anode bias.

19 Claims, 5 Drawing Figures

INVENTOR
NICHOLAS G. MUSKOVAC

BY Flait, Gipple & Jacobson
ATTORNEYS

INVENTOR
NICHOLAS G. MUSKOVAC
BY Fleit, Gipple & Jacobson
ATTORNEYS

RAMP GENERATOR AND VARIABLE DUTY-CYCLE SWITCHING CIRCUIT

BACKGROUND OF THE INVENTION

The uses for ramp generators are numerous and well known. However, a majority of the known ramp generators are complex in design and require external power supplies for their operation. Frequently, the known ramp generators are relatively insensitive, requiring substantial input power. And, the known ramp generators are often designed for a particular use, thereby detracting from the flexibility of the devices.

In addition to the above, there exists a need for simple, reliable circuitry adapted to feed a load with constant amplitude power, but in such a manner that the time during which the power reaches the load is incrementally variable. There are known circuits which are capable of delivering variable power to loads, but these circuits are often complex, noisy and relatively expensive. It is toward the goal of providing circuitry for eliminating the above-enumerated needs that the present invention is directed.

SUMMARY OF THE INVENTION

The present invention relates to a circuit which is capable of delivering a constant amplitude signal to a load and which is able to incrementally vary the time during which power is delivered to the load. The variable duty-cycle switching circuit of the present invention is reliable, uses a minimum number of elements, and, consequently, is relatively inexpensive. With the circuit of the present invention, the power delivered to the load is relatively noiseless. And, with the inventive circuit, only a single transformer is required for isolation between the control signal section and the thyristor gate and supply line section.

The switching circuit of the present invention depends, for its operation, upon a novel ramp generator. The input to the ramp generator is a variable DC voltage and the output is a sawtooth wave whose amplitude varies with the amplitude of the DC control voltage. In one embodiment, the sawtooth output of the novel ramp generator varies in amplitude while riding on a variable DC reference voltage. In another embodiment, however, the amplitude of the sawtooth remains constant, only the DC reference voltage varying in response to changes in the DC control voltage.

The inventive ramp generator is simple in design and is yet quite sensitive. Even when the ramp generator of the present invention is associated with an amplifier stage, approximately 6 milliwatts of control signal (2 milliamps at 3 volts DC) is all that is required for its operation. And, further, the ramp generator forming a part of the present invention is quite versatile. For example, the design of the inventive circuit makes the circuit particularly useful in the field of threshold level detection. And, as described above, the novel circuit forms an integral part of a circuit for controlling the on-time in relation to the off-time of solid state switches, thereby controlling the time during which power reaches a load.

Accordingly, it is the main object of the present invention to provide a circuit for controlling the power reaching a load by incrementally varying the time during which power is delivered, and in doing so with solid state elements.

It is another object of the present invention to control power with but a single transformer for isolating the DC control signal from the solid state switching elements and supply line.

It is yet a further object of the present invention to provide a versatile sawtooth ramp generator operating without an external power supply, the generator requiring only a low level DC control voltage.

It is still another object of the present invention to provide a sawtooth ramp generator whose output is variable in amplitude and rides on top of a variable DC control voltage.

Yet a further object of the present invention is to provide a variable duty cycle switching circuit having a sawtooth ramp generator supplying the control winding of a transformer for developing gating signals to solid state switching elements.

These and other objects of the present invention, as well as many of the attendant advantages thereof, will become more readily apparent when reference is made to the following description taken in conjunction with the accompanying drawings.

DETAILED DESCRIPTION OF THE DRAWINGS

Figure 1:
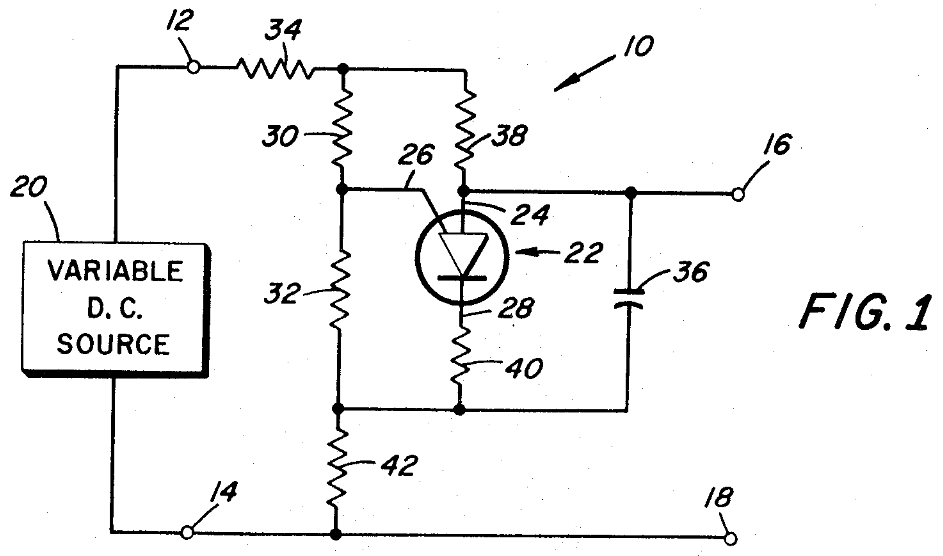
FIG. 1 is a circuit schematic of the sawtooth ramp generator forming a part of the present invention.

With reference first to FIG. 1, the ramp generator of the present invention will be described. The novel ramp generator is shown generally at 10 and has a pair of input terminals 12 and 14 and a pair of output terminals 16 and 18. A variable DC voltage source 20 is connected across the input terminals 12 and 14 and the output of the circuit is extracted at the terminals 16 and 18. The main element in the ramp generator 10 is a three-element semiconductor thyristor 22 having an anode 24, an anode-gate 26 and a cathode 28.

The operation of the thyristor 22 is controlled by the voltage reaching the anode-gate 26. This voltage is, in turn, determined by a voltage divider made up of a pair of resistors 30 and 32, respectively. When the thyristor 22 is in its conductive state, current passes in a unilateral direction as in a conventional rectifier, the thyristor 22 becoming conductive when its anode-gate 26 reaches a negative level of approximately 0.7 volts with respect to its anode 24.

The variable DC source 20 impresses a voltage across input terminals 12 and 14; and a variable current limiting resistor 34 is in the input line and serves to adjust the input impedance of the circuit. When the variable DC source 20 is active, current flows through the resistors 30 and 32 and, therefore, a voltage instantaneously appears on the anode-gate 26. There is, however, an initial time delay before the thyristor 22 becomes conductive. This time delay is defined by a capacitor 36 and a resistor 38.

As noted previously, a voltage is impressed upon the anode-gate 26 at the instant the variable DC voltage source 20 is activated. The voltage impressed upon the anode 24, on the other hand, gradually rises from 0 and continues to rise until the anode 24 is approximately 0.7 volts positive with respect to the anode gate 26. At this time, the thyristor 22 fires, thereby discharging the capacitor 36 and reinitiating the charging cycle.

Figure 2:
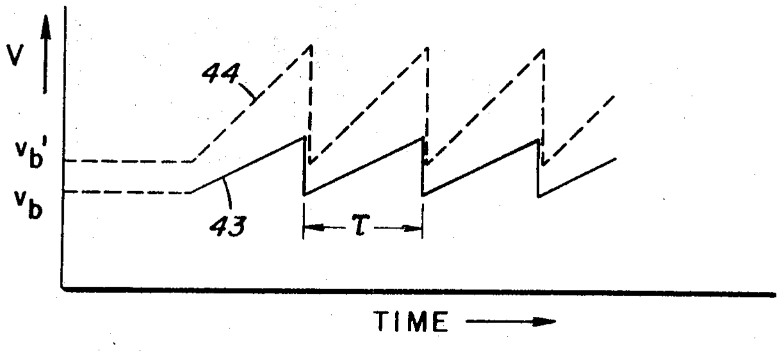
FIG. 2 is a curve of voltage versus time showing the output of the ramp generator illustrated in FIG. 1.

The time required for the capacitor 36 to rise to a voltage approximately 0.7 volts higher than the voltage which instantaneously appears on the anode-gate 26 is the period of the ramp generator 10. As stated previously, this time is controlled by the R-C time constant defined by the resistor 38 and the capacitor 36, and is shown in FIG. 2 as $\tau$.

After the discharge of the capacitor 36, the voltage on the anode 24 is again lower than the voltage on the anode-gate 26; under these conditions, the thyristor 22 is in its non-conductive state. Then, the voltage appearing across the capacitor 36 rises until the voltage again reaches approximately 0.7 volts positive with respect to the voltage on the anode-gate 26. At this occurrence, the thyristor 22 switches to its conductive state, thus discharging the capacitor 36, and thereby initiating another charging cycle of the circuit. A current limiting resistor 40 is placed in series with the thyristor 22 to protect the thyristor when the capacitor 36 discharges its energy.

The output of the ram generator 10 is taken across the output terminals 16 and 18. As seen from FIG. 1, this output voltage is the sum of the voltage across the capacitor 36 and the voltage across the resistor 42. As also seen in FIG. 1, the voltage drop across resistor 42 is directly proportional to the voltage developed by the source 20. That is, as the amplitude of the voltage source 20 increases, so too does the voltage drop across the resistor 42. As a consequence, the output voltage of the source 20 directly controls the output of the ramp generator 10 appearing at terminals 16 and 18.

There is not, however, a 1 to 1 relationship between the amplitude of the DC voltage source 20 and the output across terminals 16 and 18. This is clearly shown in FIG. 2. As the output of the DC voltage source 20 increases, the voltage drop across resistor 42 also increases. Therefore, the reference voltage, indicated at $V_b$ increases. And, at the same time, because the capacitor 36 ultimately experiences a higher voltage, the maximum voltage across the capacitor also increases. The solid curve 43 in FIG. 2 represents the voltage across the capacitor 36 at a given value of the DC voltage source 20. The curve 44, shown in phantom, represents the voltage across the capacitor 36 at a higher value of the DC voltage source 20. It will be noted that at the higher value of the DC voltage source 20, the reference voltage increases, the increased level being represented at $V'_b$.

Above, one embodiment of the inventive ramp generator has been described. It should be appreciated that this ramp generator is extremely simple in design. Further, it should be appreciated that the control of the generator is done without a complex external power supply, but, instead, with a low level DC control voltage. However, as described above, when the control voltage is changed, the output signal is changed both in amplitude and in wave shape. In a second embodiment of the invention, the amplitude of the output signal from the ramp generator is changed without a corresponding change in wave shape.

Figure 3:
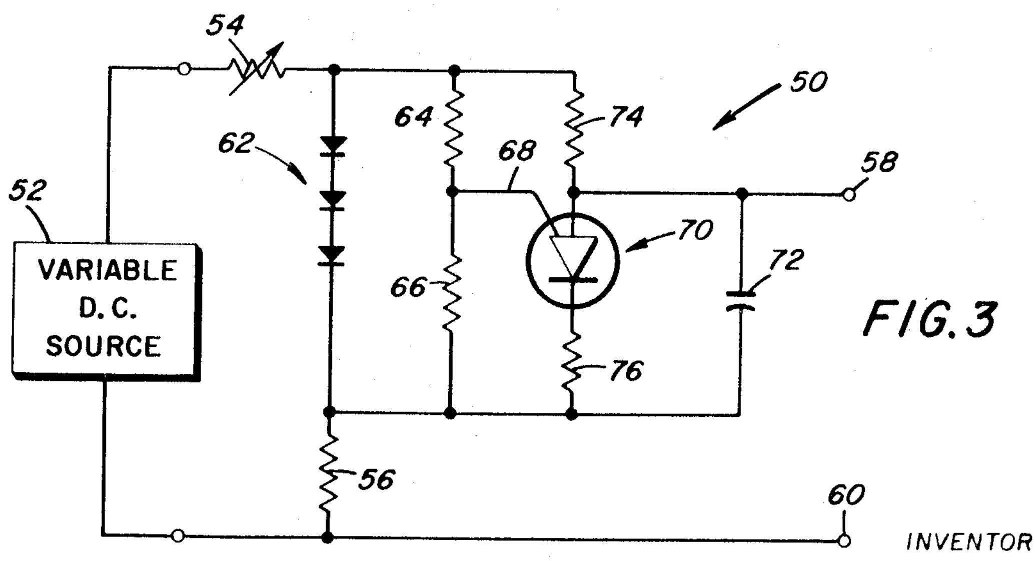
FIG. 3 is a circuit schematic of a second embodiment of the sawtooth ramp generator forming a part of the present invention.

With reference, then, to FIG. 3, the second embodiment of the ram generator forming a part of the present invention will be described, a schematic of this embodiment being shown generally at 50. Since the circuit of FIG. 3 is similar in most respects to the circuit shown in FIG. 1, only the differences will be described in detail.

The circuit of FIG. 3 is powered by a variable DC voltage source 52 developing a current which passes through a variable current limiting resistor 54 connected in series with the source. A resistor 56, performing a similar function to the resistor 42 shown in FIG. 1, and a capacitor 72, are connected across the output terminals 58 and 60. The output voltage is therefore the sum of the voltages across the resistor 56 and the capacitor 72. Where, however, a voltage divider is connected in series with the resistor 42 in FIG. 1, a diode set 62 is connected in series with the resistor 56 shown in FIG. 3.

A voltage divider, comprising a pair of resistors 64 and 66, associates with the anode-gate 68 of a thyristor switching element 70. The remaining elements of the circuit are like those shown in FIG. 1 and comprise a resistor 74 associated with the capacitor 72, and a current limiting resistor 76.

The operation of the ramp generator 50 is as follows. The variable DC voltage source 52 is activated and, after the current through the diode set 62 reaches a given level, a voltage is impressed across the diode set. Because of the well known characteristics of silicon diodes, the voltage across the diode set 62 remains relatively constant notwithstanding substantial variations in the output of the voltage source 52. In the specific example illustrated, three diodes make up the diode set 62, and each of the diodes drops the voltage approximately 0.7 volts. Therefore, there is a 2.1 volt drop across the diode set 62.

As noted previously, the voltage drop across the diode set 62 is relatively insensitive to changes in the output of the voltage source 52. Therefore, the voltage divider defined by resistors 64 and 66 experiences a relatively constant input voltage. And, accordingly, the thyristor 70 fires at the same voltage level independent of the output of the source 52. The result is that the circuit shown in FIG. 3 exhibits a more linear load output than the circuit shown in FIG. 1; this is the function of the diode set 62. The output of the FIG. 3 circuit varies only in accordance with the voltage drop across the resistor 56, this voltage varying directly with the output of the DC voltage source 52.

In the specific example, the values of the resistors 64 and 66 are selected so that the thyristor 70 fires when the voltage across the diode chain 62 reaches 2.1 volts. The ohmic value of the resistor 56 is low when compared to the combined ohmic values of resistors 64 and 66. In this way, the voltage drop across resistor 56 is extremely low (0.05 to 0.1 volts) up until the time when the thyristor 70 becomes conductive.

Figures 4, 5:
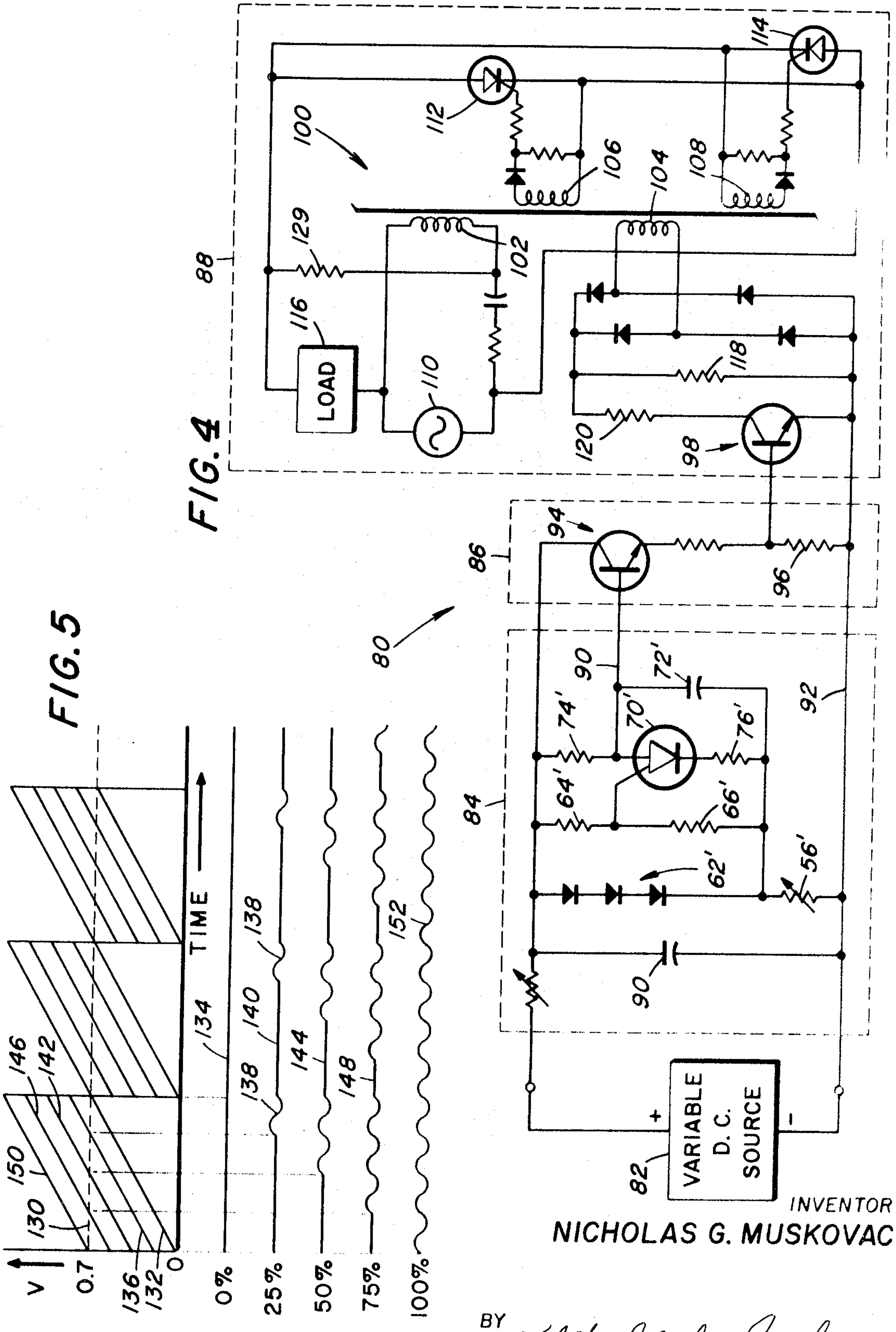
FIG. 4 is a circuit schematic of the variable duty-cycle switching circuit of the present invention.
FIG. 5 is a plot of voltage versus time showing the output of the ramp generator illustrated in FIG. 4 and further showing the relation between the output of the ramp generator and the input power reaching the load.

With reference to FIG. 5, it can be seen that as the DC control signal increases, so too does the peak value of the output voltage. However, this is accomplished without change in the shape of the output signal; only the voltage across resistor 56 changes and, accordingly, only the reference level of the output voltage increases.

The respective ramp generators shown in FIGS. 1 and 3 are particularly suited for use in a variable duty-cycle switching circuit. This circuit is shown in FIG. 4 and forms a part of the present invention. With this circuit, a low level DC input voltage is used to control the duty cycle of a load requiring relatively high voltages.

With reference then to FIG. 4, the inventive variable duty-cycle switching circuit will be described. The inventive circuit is shown generally at 80 and comprises, basically, a variable DC voltage source 82, a ramp generator section 84, an amplifier section 86, and a noiseless zero-switching silicon control rectifier (SCR) control circuit 88. The DC voltage source 82 and the ramp generator section 84 are identical to the corresponding elements shown in FIG. 3 (with the addition of a capacitor 90 for filtering the noise out of the DC control signal). The amplifier 86 is a conventional emitter-follower amplifier serving to amplify the sawtooth output current developed by the ramp generator section 84. And, the zero-switching control circuit 88 takes a form similar to the circuit disclosed in U.S. Pat. No. 3,417,320 granted to the present inventor on Dec. 17, 1968.

The inventive circuit 80 operates as follows. A DC signal is developed by the variable DC voltage source 82. This signal, as explained with reference to FIG. 3, is acted upon by the ramp generator section 84 which develops a sawtooth wave across terminals 90 and 92. The sawtooth output signal is then amplified by an emitter-follower amplifier 94. The amplified signal from the amplifier 94 develops a voltage across a resistor 96 acting at the base of a transistor 98 in the control circuit 88. The transistor 98, more fully described below, functions as an amplifier and threshold detector.

As described in U.S. Pat. No. 3,417,320, the control circuit 88 comprises a square loop core transformer 100 having a pair of primary windings 102 and 104 and a pair of secondary windings 106 and 108, respectively. An AC power source 110 feeds a continuous AC signal to the primary winding 102 of the transformer 100 and, when SCR switch 112 and SCR switch 114 are in their conductive states, the source 110 supplies power to the load 116.

The AC power source 110, through the primary winding 102 of the transformer 100 induces gate pulses in the secondary windings 106 and 108. These gate pulses are rectified and are fed to the anode gates of the respective SCR switches 112 and 114.

As explained in U.S. Pat. No. 3,417,320, the load 116 receives power from source 110 only when the trailing edges of the gate pulses occur within the half-cycle of positive anode bias on the SCR switches 112 and 114. When the SCR switches 112 and 114 are made conductive in this way, and as again explained in the above noted U.S. patent, the noise level in the control circuit 88 is minimized. It is the signal on the primary winding 104 which controls the positions of the trailing edges of the gate pulses reaching the anode-gates of SCR switches 112 and 114.

The primary winding 104 of the transformer 100 may therefore be termed a control winding. When the resistance across the control winding 104 is decreased, the gate pulses reaching the anode-gates of the SCR switches 112 and 114 are elongated so that the trailing edges of the gate pulses move within the half-cycles of positive anode bias. And, in this manner, when the resistance across the control winding 104 is decreased, the SCR switches 112 and 114 become conductive and AC power is delivered to the load 116.

As stated in the preceding paragraph, the conductivity of the SCR switches 112 and 114 determines whether power reaches the load. As also noted previously, the state of the transistor 98 controls the conductivity of the SCR switches; and the state of the transistor 98 is, in turn, controlled by the voltage appearing at its base electrode, and thus the state of transistor 94.

As seen in FIG. 4, the resistor 56' is variable. Since the voltage appearing at the base electrode of transistor 94 is controlled by the value of resistor 56', the variable resistor 56' serves as a gain control element. When the value of resistor 56' is high, a large voltage drop appears across this resistor and, therefore, the SCR switches are made conductive with the application of a relatively small input current from the DC source 82. On the other hand, when the value of the resistor 56' is low, a higher input current from the source 82 is needed to place the SCR switches in their conductive states.

When the transistor 98 is in its non-conductive state, the resistance associated with the control winding 104 is high, this resistance being defined by the value of the resistor 118. However, when the transistor 98 is in its conductive state, the resistance associated with the control winding 104 is low, this latter resistance being defined by the parallel combination of resistor 118 and resistor 120. The circuit parameters are chosen so that when the transistor 98 is in its conductive state, the gate pulses reaching the SCR switches 112 and 114 are elongated so that the trailing edges fall within the half-cycles of positive anode bias and, as a consequence, the load 116 receives power. When the transistor 98 is in its non-conductive state, on the other hand, the load receives no power. Four diodes 122–128 are associated with the collector of the transistor 98 and transform the negative parts of the induced voltage in the control winding 104 into positive voltages, thereby ensuring proper biasing on the transistor 98.

Because of the direct relationship between the conductivity of transistor 98 and the delivery of power to the load 116, it should be evident that the duty cycle of the load can be varied by acting upon the transistor 98. This is precisely what is done in the switching circuit 80 forming a part of the present invention, and will now be explained with reference to FIGS. 4 and 5.

When the variable DC voltage source 82 is activated, a voltage of approximately 2.1 volts appears across the voltage divider defined by resistors 64' and 66'. This is the result of the inherent operation of the diode chain 62'. Then, depending upon the values of the capacitor 72' and resistor 74', the voltage on the anode terminal of the thyristor 70' gradually increases. When the voltage on the anode becomes approximately 0.7 volts positive with respect to the voltage on the anode gate, the thyristor 70' fires, thereby discharging the capacitor 72'. The charging cycle is then re-initiated.

As state previously, the output of the ramp generator stage 84 is extracted from terminals 90 and 92. And, as clearly shown in FIG. 4, the signals emergent from this stage are acted upon by the amplifier stage 86 and are amplified by the emitter-follower amplifier 94. Then, after the signals emergent from the ramp generator stage 84 are amplified, they are passed to the transistor 98 in the control stage 88.

The transistor 98 becomes conductive when a signal of a predetermined voltage is applied to its base. In the specific example, before the transistor 98 conducts, the voltage appearing on its base must reach approximately 0.7 volts positive. Because of this, the transistor 98 may be termed a threshold level detector.

A resistor 129, in the circuit of the load 116, slaves SCR 112 and SCR 114 to each other so that the load never receives half-wave power.

With reference now to FIG. 5, the relationship between the output of the variable DC voltage source 82 and the on-time of the threshold level detecting transistor 98 will be explained. Naturally, though, the specific voltages given are dependent upon the circuit parameters chosen and are not intended to be limiting in any way.

In the upper part of FIG. 5, the voltage versus time curves for the signals appearing across resistor 96, associated with transistor 98, are shown. In the lower part of FIG. 5, the on-time relative to the off-time of the transistor 98, and thus the time during which power reaches the load, is illustrated.

It was noted previously, that the threshold level of the transistor 98 is defined by the voltage on its base terminal required to make the transistor conductive, and that the specific value of this threshold level is 0.7 volts positive. In FIG. 5, the 0.7 volt threshold line is indicated, in phantom, at 130. When the output of the variable DC voltage source is 1.0 milliamperes, the voltage appearing across resistor 96 takes the form illustrated in curve 132. It is seen that at no time does the voltage curve 132 cross and rise above the 0.7 volt threshold line 130. Therefore, and as shown in curve 134, the transistor 98 never becomes conductive and therefore, the load 116 never receives power.

When the output of the variable DC voltage source 82 is raised to 2.0 milliamperes, the voltage appearing across the resistor 96 takes the form shown in curve 136. This curve, unlike curve 132 described above, rises above the 0.7 volt threshold line 130. During this time, and as represented at 138 in curve 140, the transistor 98 becomes conductive, and, accordingly, the load 116 receives power. In this case, the on-time of the transistor 98 is one-quarter the total time. Consequently, there is a 25 percent power output under these circumstances.

The curve 142 represents the conditions when the variable DC voltage source has an output of 3.0 milliamperes. As shown at 144, this condition results in a 50 percent power output. Similarly, the power output is 75 percent when the variable DC source delivers 4.0 milliamperes of current, this condition being indicated by curves 146 and 148. And, when 5.0 milliamperes of current is delivered by the variable DC voltage source 82, the voltage appearing across resistor 96 is constantly above the 0.7 volt threshold line 130. This is shown at 150. And, as shown at 152, this condition results in 100 percent power output.

It will be remembered that the shape of the curves 132, 136, 142, 146 and 150 remains unchanged, notwithstanding changes in the voltage level at which these curves appear. This is brought about by the operation of the diode chain 62' shown in FIG. 4. The reference levels at which the individual curves are centered is therefore defined solely by the voltage drop appearing across resistor 56', and, in turn, this voltage drop is dependent directly upon the output of the variable DC voltage source 82. The emitter-follower amplifier 94 amplifies the sum of the signals appearing across the capacitor 72' and the resistor 56'. This composite signal then appears across the resistor 96, and it is this signal which is represented in the curves of FIG. 5.

As fully explained in U.S. Pat. No. 3,417,320, the conduction of the transistor 98 results in an elongation of the gating pulses appearing at the gates of the SCR switches 112 and 114. When this elongation of the gating pulses occurs, the SCR switches become conductive and, consequently, the load 116 receives power from the power source 110. Therefore, the output from the variable DC voltage source 82, in controlling the on-time of the transistor 98, controls the time during which the load 116 receives power. For this reason, the curves shown in FIG. 5 relate not only to the on-time of the transistor 98 but relate, as well, to the time during which the load 116 receives power from the AC power source 110.

It should be appreciated that while FIG. 5 illustrates changes in the variable DC voltage source in 1.0 milliampere steps, this is not necessarily the case. Rather, the variable DC voltage source 82 may be made incrementally variable, thereby providing the circuit with the capability of delivering any desired percentage of power to the load. In fact, the voltage control dial on the variable voltage source could be made to indicate directly the percentage of power delivery.

Above, several embodiments of the present invention have been described. It should be appreciated, however, that these embodiments are described for purposes of illustration only and that numerous alternations and modifications may be practiced by those skilled in the art without departing from the spirit and scope of the invention. Accordingly, it is the intent that the invention not be limited by the above but be limited only as defined in the appended claims.

Following, there is a list of circuit parameters for the circuit illustrated in FIG. 4:

| | |
|---|---|
| SCR **112** and SCR **114** | 7.4 a., 300 v. |
| R **129** | 100 K ohms, 1 w. |
| Thyristor **70** | GE unijunction D 13 T 1 |
| All diodes | 10 D 1 |
| Transistors **94** and **98** | 2 N 4424 |
| C **72** | 33 mfd, 6 v. |
| C **90** | 2.2 mfd, 20 v. |
| R **74** and R **118** | 47 K ohms, ½ W. |
| R **76** | 22 ohms, ½ w. |
| R **64** | 3.3 K ohms, ½ w. |
| R **66** | 2.2 K ohms, ½ w. |
| R **96** | 22 K ohms, ½ w. |
| Transformer **100** | B 31–81–125 |

What is claimed is

1. A solid state ramp generator operating in response to a low level DC input, the generator comprising: a pair of input terminals and a pair of output terminals; means for delivering DC power to said input terminals; a solid state switching element having an anode, a cathode, and an anode-gate, said switching element having a conducting mode and a non-conducting mode; means for instantaneously applying a portion of said DC power, in the form of a voltage, to the anode-gate of said switching element; energy storage means associated with the output terminals and the anode of said switching element, said storage means adapted to store energy received from said power delivering means; period-determining means associated with said energy storage means for defining, with said storage means, the period of said generator; means for transmitting information, proportional to the energy stored by said energy storage means, to said output terminals; and base voltage means for maintaining a DC voltage across said output terminals at all times during the operation of the generator; the anode and the anode-gate of said switching element being associated in such a manner that said switching element switches to its conductive mode in response to the energy stored by said storage means, said switching element causing the discharge of said energy storage means when said switching element is in its conductive mode.

2. The ramp generator defined in claim 1, and further comprising: resistor means connected in series with said energy storage element for developing a voltage directly proportional to the input from said power delivering means, said energy storage element and said resistor being connected directly across said output terminals.

3. The ramp generator recited in claim 2, and further comprising: a voltage divider associated with said power delivering means and with the anode-gate of said switching element, said voltage divider defining the instantaneous voltage impressed upon the anode-gate of said switching element when said power delivering means is operative.

4. The ramp generator defined in claim 3, wherein said switching element switches to its conductive mode when the voltage impressed upon its anode reaches a voltage positive, by a predetermined amount, with respect to its anode-gate, said voltage divider defining the voltage impressed upon said anode-gate, and said energy storage element defining the voltage impressed upon said anode.

5. The ramp generator recited in claim 4, wherein said switching element switches to its conductive mode when its anode is approximately 0.7 volts positive with respect to its anode-gate.

6. The ramp generator defined in claim 3, and further comprising: means for developing a constant voltage across said voltage divider.

7. The ramp generator recited in claim 6, wherein said means for developing a constant voltage is in the form of a diode chain.

8. The generator defined in claim 1, and further comprising: means for filtering noise out of the power delivered by said power delivering means.

9. The ramp generator recited in claim 1, and further comprising means for limiting the current flow through said switching element.

10. A variable duty-cycle switching circuit for proportionally controlling the power reaching a load in response to a low level DC input signal, the circuit comprising: a variable source of DC power; ramp generator means for receiving said DC power and for issuing a signal, the amplitude of which is proportional to the amplitude of the output of said DC power source; base voltage means in said ramp generator means for maintaining a DC voltage across the output of said generator at all times during its operation; threshold level detection means associated with the output of said ramp generator and adapted to become conductive when the amplitude of the output signal from said ramp generator is above a predetermined threshold level; a load; and AC power source associated with said load; switching means for interrupting the path between said AC power source and said load, power reaching the load only when said switching means are conductive; and means intermediate said switching means and said threshold level detector for activating said switching means when said threshold level detector indicates that the signal output of said ramp generator is above said predetermined voltage level.

11. The circuit defined in claim 10, and further comprising: means intermediate said ramp generator and said threshold level detector for amplifying the signals from said ramp generator and for transmitting said amplified signals to said threshold level detector.

12. The circuit recited in claim 11, wherein said ramp generator comprises a solid state switching element having an anode, a cathode and an anode-gate; voltage delivery means for impressing a portion of the signal from said DC voltage source on the anode-gate of said switching element; and energy storage means associated with the anode of said switching element and with said DC voltage source; said switching element becoming conductive when the voltage across said energy storage means reaches a predetermined level.

13. The circuit defined in claim 12, wherein said voltage delivery means comprises a voltage divider network associated with the anode-gate of said switching element.

14. The circuit defined in claim 13, and further comprising: a diode chain connected in parallel with and adapted to provide a relatively constant voltage to said voltage divider.

15. The circuit defined in claim 14, and further comprising: a resistor associated with said DC voltage source and connected across the output terminals of said ramp generator; said resistor experiencing a voltage drop, the amplitude of which is directly proportional to the amplitude of the signal developed by said DC voltage source.

16. The circuit defined in claim 10, and further comprising a transformer for isolating said variable source of DC power from said switching means and AC power source.

17. The circuit defined in claim 16, wherein said transformer has first and secondary primary windings and first and second secondary windings, said first primary winding being in the circuit of said threshold level detection means, said second primary winding being in the circuit of said AC power source, and said first and second secondary windings being in the respective circuits of said switching means.

18. The circuit recited in claim 10, and further comprising means for slaving said switching means to one another.

19. The circuit recited in claim 10, and further comprising means for adjusting the gain of said variable duty-cycle switching circuit.

* * * * *